(12) United States Patent  
Chiba

(10) Patent No.: US 9,653,304 B2  
(45) Date of Patent: May 16, 2017

(54) SEMICONDUCTOR DEVICE AND METHOD OF MANUFACTURING SEMICONDUCTOR DEVICE

(71) Applicant: LAPIS SEMICONDUCTOR CO., LTD., Kanagawa (JP)

(72) Inventor: Akira Chiba, Miyagi (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 14/937,367

(22) Filed: Nov. 10, 2015

(65) Prior Publication Data

US 2016/0141407 A1 May 19, 2016

(30) Foreign Application Priority Data

Nov. 14, 2014 (JP) ................................ 2014-231861

(51) Int. Cl.

| | | |
|---|---|---|
| *H01L 21/336* | (2006.01) | |
| *H01L 21/28* | (2006.01) | |
| *H01L 29/66* | (2006.01) | |
| *H01L 29/423* | (2006.01) | |
| *H01L 29/788* | (2006.01) | |

(Continued)

(52) U.S. Cl.

CPC .. *H01L 21/28273* (2013.01); *H01L 29/42328* (2013.01); *H01L 29/6653* (2013.01); *H01L 29/66825* (2013.01); *H01L 29/7881* (2013.01); *H01L 21/31053* (2013.01); *H01L 21/32139* (2013.01)

(58) Field of Classification Search

USPC ......................... 438/257, 201, 593, 264, 266  
See application file for complete search history.

(56) References Cited

U.S. PATENT DOCUMENTS

| | | | | |
|---|---|---|---|---|
| 6,727,144 B2 * | 4/2004 | Hashimoto | ....... | H01L 27/11521 |
| | | | | 257/E21.682 |
| 7,169,672 B1 * | 1/2007 | Jung | ..................... | H01L 29/792 |
| | | | | 257/E21.179 |

(Continued)

FOREIGN PATENT DOCUMENTS

| | | |
|---|---|---|
| JP | 2004-200181 A | 7/2004 |
| JP | 2006-179736 A | 7/2006 |

OTHER PUBLICATIONS

Ito et al. "Properties of a Photoresist Film as an Insulating Layer", Aug. 1980, Japanese Journal of Applied Physics, vol. 19, o. 8, pagers L460-L462.*

(Continued)

*Primary Examiner* — Telly Green  
(74) *Attorney, Agent, or Firm* — Volentine & Whitt, PLLC

(57) ABSTRACT

A method of manufacturing a semiconductor device includes forming a first gate member on a semiconductor substrate through a gate insulating film, forming a spacer on the first gate member, flattening a surface of the spacer, forming a first gate by partially etching the first gate member using the spacer as a mask, forming a second gate member so as to cover the first gate and the spacer having the flattened surface, forming a first insulating film on a surface of the second gate member, and forming a second gate by causing the second gate member to retreat while removing the first insulating film by etching.

9 Claims, 19 Drawing Sheets

(51) Int. Cl.
  *H01L 21/3213*  (2006.01)
  *H01L 21/3105*  (2006.01)

(56) References Cited

U.S. PATENT DOCUMENTS

| | | | | |
|---|---|---|---|---|
| 7,211,486 | B2* | 5/2007 | Ozeki | H01L 21/28273 |
| | | | | 257/E21.209 |
| 7,582,930 | B2* | 9/2009 | Yoshino | H01L 21/265 |
| | | | | 257/317 |
| 7,851,350 | B2* | 12/2010 | Cho | H01L 21/76804 |
| | | | | 257/E21.577 |
| 8,377,774 | B2* | 2/2013 | Nagai | H01L 27/115 |
| | | | | 257/314 |
| 8,617,951 | B2* | 12/2013 | Matsuzaki | H01L 27/115 |
| | | | | 438/201 |
| 9,281,202 | B2* | 3/2016 | Choi | H01L 21/28273 |
| 2001/0009491 | A1* | 7/2001 | Sasaki | B82Y 10/00 |
| | | | | 360/318 |
| 2010/0270605 | A1* | 10/2010 | Choi | H01L 21/28273 |
| | | | | 257/316 |

OTHER PUBLICATIONS

Pierce et al. "Dielectric Properties fo Thin Insulating Films of Photoresist Material", Mar. 1965, IEEE Transactions on Component Parts, pp. 8-11.*

* cited by examiner

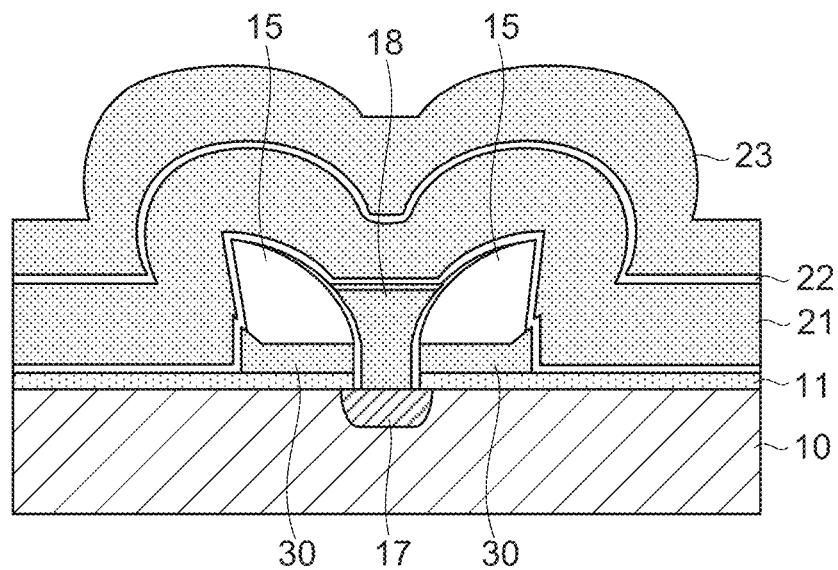
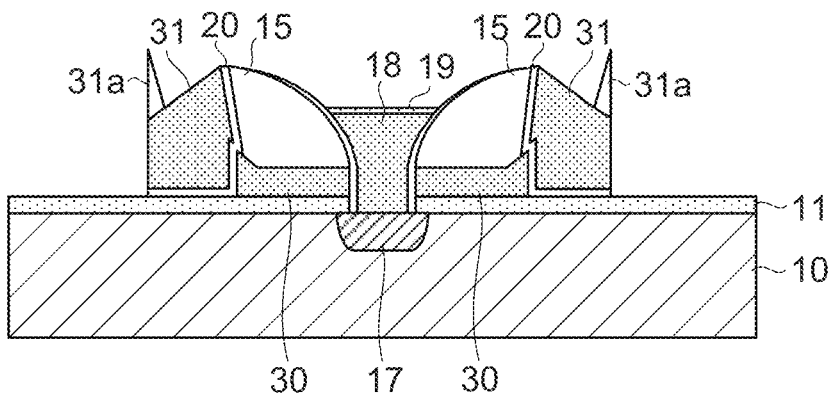

POLYSILICON FILM (GATE MEMBER)

VERTICAL SHAPE

POLYSILICON FILM (GATE MEMBER)

OVERHANG SHAPE

CONTROL GATE (WORD LINE)

PROTRUDING PORTION

CONTROL GATE (WORD LINE)

SEMICONDUCTOR DEVICE AND METHOD OF MANUFACTURING SEMICONDUCTOR DEVICE

CROSS-REFERENCE TO RELATED APPLICATION

This application claims priority under 35 USC 119 from Japanese Patent application No. 2014-231861 filed on Nov. 14, 2014, the disclosure of which is incorporated by reference herein.

BACKGROUND

Technical Field

The present disclosure relates to a semiconductor device and a method of manufacturing the semiconductor device.

Related Art

As an electrically erasable programmable read-only memory (EEPROM), a split gate semiconductor memory is known.

For example, Japanese Patent Application Laid-Open (JP-A) No. 2004-200181 describes a method of manufacturing a split gate semiconductor memory, and the manufacturing method includes the following steps: a first step of forming a tapered portion serving as a floating gate by etching a polysilicon film using a silicon nitride film as a mask having an opening; a second step of forming a first thermal oxide film on the polysilicon film in the opening of the silicon nitride film; a third step of forming a spacer of a first NSG film covering the tapered portion of the polysilicon film in a side wall of the opening of the silicon nitride film; a fourth step of thermally processing the spacer of the first NSG film so as to form a minute film; a fifth step of forming a spacer of a second NSG film inside the spacer of the first NSG film; a sixth step of forming a polysilicon plug so as to fill the opening of the silicon nitride film and subsequently forming a second thermal oxide film on the polysilicon plug; a seventh step of removing only the silicon nitride film; an eighth step of etching the polysilicon film using the spacer of the first NSG film, the spacer of the second NSG film, and the second thermal oxide film as masks; and a ninth step of removing the spacer of the first NSG film.

On the other hand, JP-A No. 2006-179736 describes a method of manufacturing a split gate memory cell, and the manufacturing method includes the following steps of: forming a floating gate on a semiconductor substrate through an insulating film; forming a source region partially overlapping with the floating gate, on the surface of the semiconductor substrate through the insulating film; forming a tunnel insulating film on the floating gate; forming a control gate on the floating gate and on the semiconductor substrate adjacent to the floating gate through the tunnel insulating film; forming a drain region of a low concentration by injecting impurity ions into the semiconductor substrate using the control gate as a mask; forming a first spacer film in a side wall of the control gate; and forming a drain region of a high concentration by injecting impurity ions into the semiconductor substrate using the first spacer film and the control gate as masks.

The split gate semiconductor memory uses the spacer made of an insulator in order to form the control gate functioning as a word line in a self-aligned manner with respect to the floating gate. The spacer is layered on the floating gate, and is also used in patterning of the floating gate. The control gate is formed by forming a gate member such as polysilicon so as to cover the floating gate and the spacer after the patterning of the floating gate, and being subjected to etch-back processing.

In the conventional manufacturing method, the shape of the gate member at the time of forming the film is influenced by the shape of the spacer so as to be formed in an overhang shape (see FIG. 9B). The insulating film is occasionally provided on the surface of the gate member having the overhang shape, in order to form a peripheral circuit, and the insulating film is formed along the overhang shape of the gate member. In the etch-back processing of the gate member, the insulating film is also etched together with the gate member at the same time. However, the etching of the insulating film progresses slower than the etching of the gate member due to the overhang shape of the gate member. At the time of completion of the etch-back processing, the insulating film is left in a protruding shape, and a protruding portion is occasionally generated in the end portion of the control gate (see FIG. 10B). Subsequently, when a metal compound layer such as a silicide layer is formed on an upper surface of the control gate by a salicide process in order to reduce the resistance of the control gate, the formation of the metal compound layer is hindered due to the generation of the structure of the protruding shape in the control gate, and the control gate is hardly lowered in resistance.

SUMMARY

The disclosure has been made in view of the above circumstances, and suppresses the overhang shape generated at the time of forming the gate member and the generation of the structure of the protruding shape which hinders the formation of the metal compound layer on the upper surface of the gate.

A first aspect of the present disclosure is a method of manufacturing a semiconductor device including forming a first gate member on a semiconductor substrate through a gate insulating film, forming a spacer on the first gate member, flattening a surface of the spacer, forming a first gate by partially etching the first gate member using the spacer as a mask, forming a second gate member so as to cover the first gate and the spacer having the flattened surface, forming a first insulating film on a surface of the second gate member, and forming a second gate by causing the second gate member to retreat while removing the first insulating film by etching.

A second aspect of the disclosure is a semiconductor device including a semiconductor substrate, a first gate that is provided on the semiconductor substrate through a gate insulating film, a spacer that is provided on the first gate and has a flattened surface, a second gate that is provided on the semiconductor substrate and adjacent to the first gate and the spacer, a source and a drain that are provided at positions between which the first gate and the second gate are interposed, a source wiring that is electrically connected to the source, and a metal compound layer that is provided on each of an upper surface of the second gate, an upper surface of the source wiring, and an upper surface of the drain.

According to the disclosure, the overhang shape generated at the time of forming the gate member can be suppressed, and the generation of the structure of the protruding shape which hinders the formation of the metal compound layer on the upper surface of the gate can be suppressed.

BRIEF DESCRIPTION OF THE DRAWINGS

Exemplary embodiments of the present disclosure will be described in detail based in the following figures, wherein:

FIG. 6B is a sectional view illustrating the method of manufacturing the semiconductor device according to the comparative example.

FIG. 6C is a sectional view illustrating the method of manufacturing the semiconductor device according to the comparative example.

DETAILED DESCRIPTION

Hereinafter, an embodiment of the disclosure will be described as an example with reference to the drawings. In each drawing, the same or corresponding components and portions are given the same reference signs. In the following description, a case where the disclosure is applied to a split gate semiconductor memory will be described. FIGS. 1A to 1D, FIGS. 2A to 2D, FIGS. 3A to 3D, FIGS. 4A to 4C, and FIGS. 5A to 5C are sectional views illustrating the method of manufacturing a semiconductor memory according to the embodiment of the disclosure.

Figure 1A:
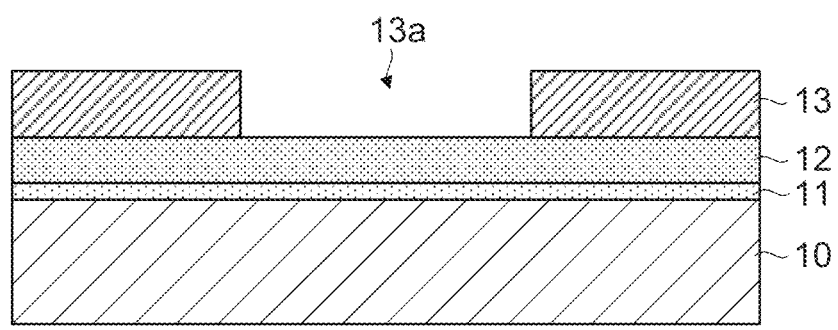
FIG. 1A is a sectional view illustrating a method of manufacturing a semiconductor device according to an embodiment of the disclosure.

First, a gate insulating film 11 made of an insulator such as silicon dioxide ($SiO_2$) and having a thickness of about 8 nm is formed on a surface of a p-type silicon substrate 10 by, for example, a thermal oxidation method. The silicon substrate 10 is an example of the semiconductor substrate in the disclosure. Next, a polysilicon film 12 having a thickness of about 80 nm is formed on the surface of the gate insulating film 11 by, for example, a chemical vapor deposition (CVD) method. The polysilicon film 12 constitutes a floating gate of a memory cell. The polysilicon film 12 is an example of a first gate member in the disclosure. Next, a silicon nitride film (SiN film) 13 having a thickness of about 300 nm is formed on the surface of the polysilicon film 12 by, for example, the CVD method. Next, an opening 13a of the silicon nitride film 13 is formed in a portion corresponding to a forming position of the floating gate and a source using a photolithography technique, and the polysilicon film 12 is exposed in the opening 13a (FIG. 1A).

Figure 1B:
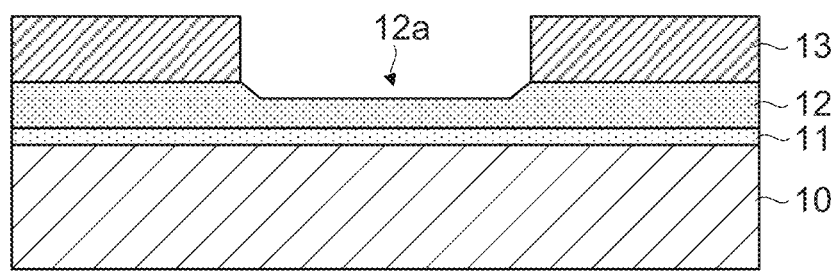
FIG. 1B is a sectional view illustrating the method of manufacturing the semiconductor device according to the embodiment of the disclosure.

Next, the surface of the polysilicon film 12 is etched by about 20 nm using the silicon nitride film 13 as a mask, and a concave portion 12a is formed on the surface of the polysilicon film 12 (FIG. 1B).

Figure 1C:
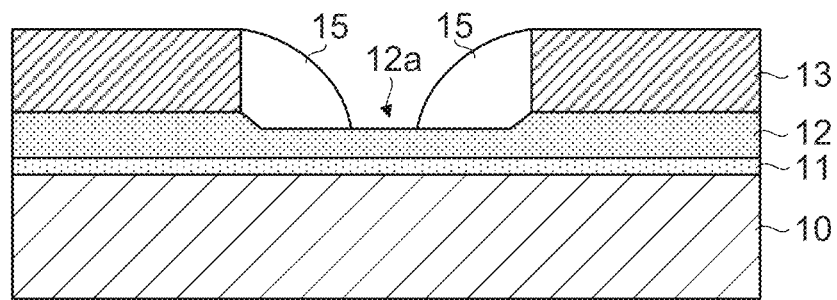
FIG. 1C is a sectional view illustrating the method of manufacturing the semiconductor device according to the embodiment of the disclosure.

Next, a non-doped silicate glass film (NSG film) is formed so as to fill the opening 13a of the silicon nitride film 13 by, for example, the CVD method. Then, a spacer 15 is formed by etch-back processing in which the NSG film retreats by an anisotropic dry etching. The spacer 15 is formed so as to abut on the side surface of the opening 13a of the silicon nitride film 13 and the upper surface of the polysilicon film 12 and to expose the polysilicon film 12 in the center portion of the concave portion 12a. In other words, the spacer 15 is formed so as to have a pair of spacer pieces which are disposed to be separated so as to face each other in the opening 13a (FIG. 1C). Note that the NSG film is an example of a spacer member in the disclosure, and the spacer 15 is an example of the spacer in the disclosure.

Figure 1D:
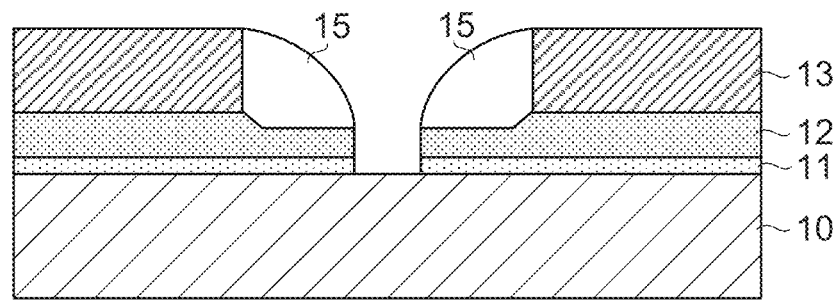
FIG. 1D is a sectional view illustrating the method of manufacturing the semiconductor device according to the embodiment of the disclosure.

Next, the polysilicon film 12 and the gate insulating film 11 are etched by a dry etching using the spacer 15 as a mask, and the silicon substrate 10 is exposed. In other words, the polysilicon film 12 is patterned by this etching processing (FIG. 1D).

Figure 2A:
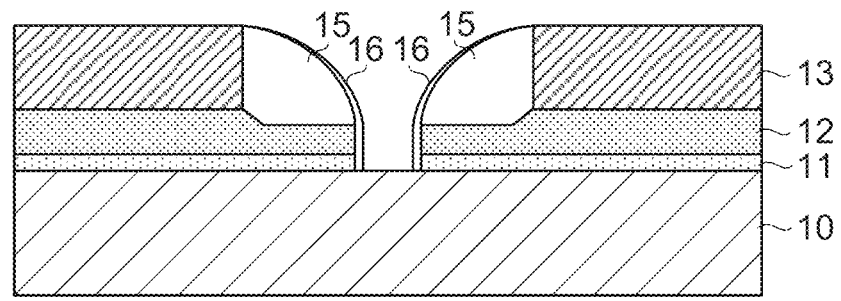
FIG. 2A is a sectional view illustrating the method of manufacturing the semiconductor device according to the embodiment of the disclosure.

Next, the NSG film is formed so as to cover the exposed portions of the silicon nitride film 13, the spacer 15, the polysilicon film 12, the gate insulating film 11, and the silicon substrate 10 by, for example, the CVD method, and subsequently a spacer 16 is formed by etching an unnecessary portion. The spacer 16 is formed so as to cover the side surfaces of the spacer 15, the polysilicon film 12, and the gate insulating film 11 while exposing the silicon substrate 10 (FIG. 2A).

Figure 2B:
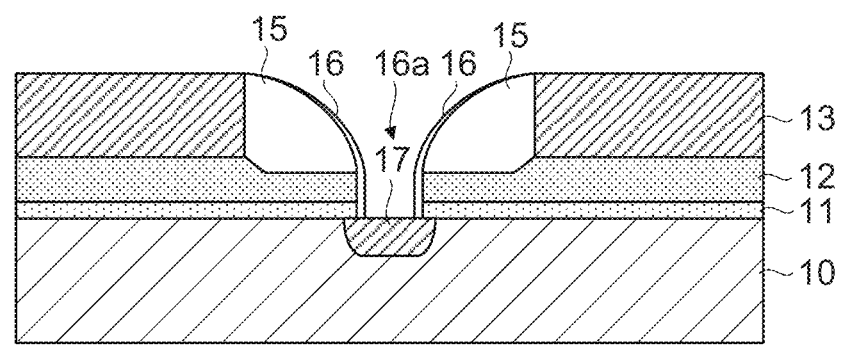
FIG. 2B is a sectional view illustrating the method of manufacturing the semiconductor device according to the embodiment of the disclosure.

Next, an n-type source 17 is formed on the surface of the silicon substrate 10 exposed in an opening 16a of the spacers 15 and 16 by, for example, an ion implantation method. In this ion implantation processing, the spacers 15 and 16 are used as masks, and a pentavalent element such as phosphorous is injected into the silicon substrate 10 (FIG. 2B). The source 17 is an example of a source in the disclosure.

Figure 2C:
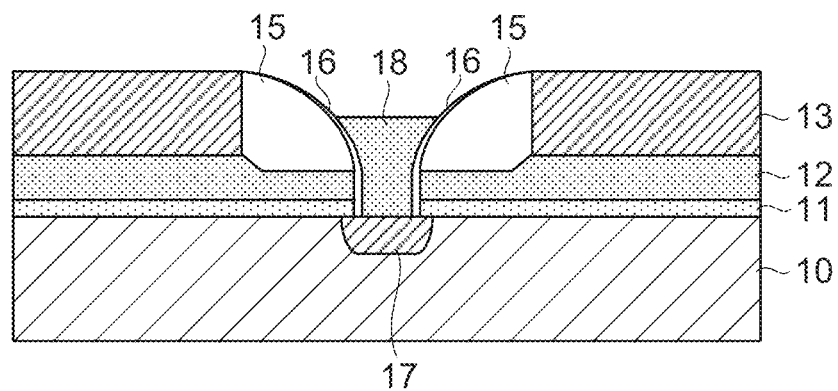
FIG. 2C is a sectional view illustrating the method of manufacturing the semiconductor device according to the embodiment of the disclosure.

Next, the polysilicon film is formed so as to fill the opening 16a of the spacers 15 and 16 by, for example, the CVD method. Then, a source wiring 18 is formed by performing the etch-back processing in which the polysilicon film retreats through the etching. The etch-back processing is performed such that the height of the source wiring 18 is lower than the heights of the upper surface of the silicon nitride film 13 and the top portions of the spacers 15 and 16. The source wiring 18 is electrically connected to the source 17 and insulated from the polysilicon film 12 by the spacer 16 (FIG. 2C). The source wiring 18 is an example of the source wiring in the disclosure, and the polysilicon film constituting the source wiring 18 is an example of a wiring material in the disclosure.

Figure 2D:
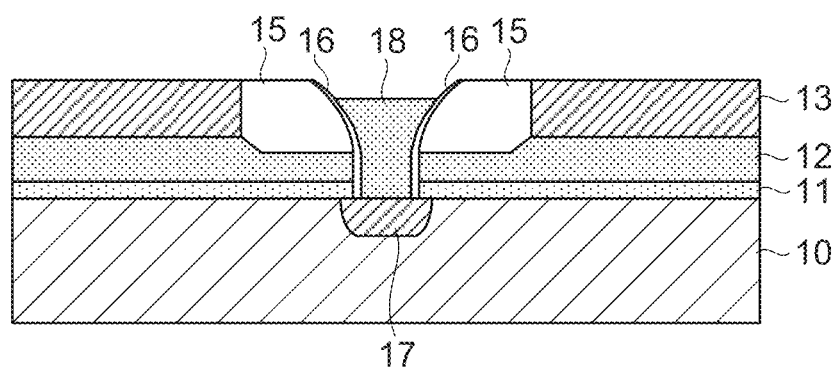
FIG. 2D is a sectional view illustrating the method of manufacturing the semiconductor device according to the embodiment of the disclosure.

Next, the upper surface of the spacer 15 is flattened by, for example, a chemical mechanical polishing (CMP). In the CMP step, the silicon substrate 10 is fixed to a spindle of a polishing device, and the spacer 15 and the silicon nitride film 13 are brought into contact with a polishing pad attached to the surface of a rotation table of the polishing device and are polished while a polishing liquid (slurry) containing silica particles is poured on the polished surfaces. The upper surface of the spacer 15 is flattened by the chemical mechanical polishing so as to be substantially parallel to the principal plane of the silicon substrate 10. In the CMP processing, the silicon nitride film 13 is polished together with the spacer 15. In other words, the upper surface of the spacer 15 is polished so as to extend in the same plane as the upper surface of the silicon nitride film 13. In this step, a polishing amount (polishing depth) can be managed by a film thickness of the silicon nitride film 13. The polishing amount (polishing depth) may be, for example, about 30 nm, and in this case, the film thickness of the silicon nitride film 13 after the polishing is about 270 nm (FIG. 2D). Since the polysilicon film constituting the source wiring 18 is subjected to the etch-back processing in the previous step, the source wiring 18 is not polished in this CMP step.

Figure 3A:
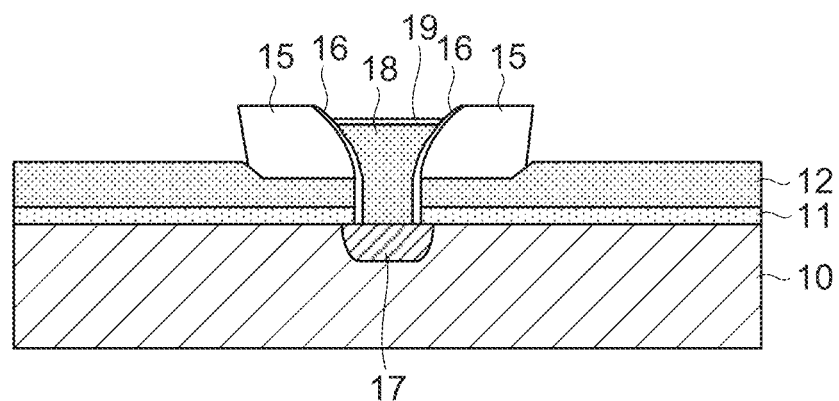
FIG. 3A is a sectional view illustrating the method of manufacturing the semiconductor device according to the embodiment of the disclosure.

Next, a protection film 19 made of an insulator such as silicon dioxide ($SiO_2$) and having a thickness of about 10 nm is formed on the surface of the source wiring 18 by, for example, the thermal oxidation method. Then, the silicon nitride film 13 is removed using, for example, phosphoric acid ($H_3PO_4$) at 150° C. Hence, the side surface of the spacer 15 is exposed (FIG. 3A).

Figure 3B:
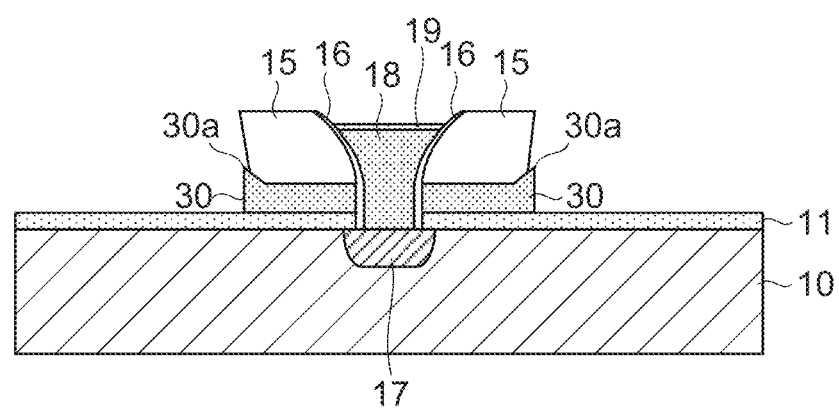
FIG. 3B is a sectional view illustrating the method of manufacturing the semiconductor device according to the embodiment of the disclosure.

Next, the polysilicon film 12 is patterned by the dry etching using the spacer 15 as a mask. Hence, a pair of floating gates 30 separated from each other with the source wiring 18 interposed therebetween is formed. A sharp portion 30a is formed in the end portion of each floating gate 30 by forming the concave portion 12a in the polysilicon film 12 in the previous step (FIG. 3B). The floating gate 30 is an example of a first gate in the disclosure.

Figure 3C:
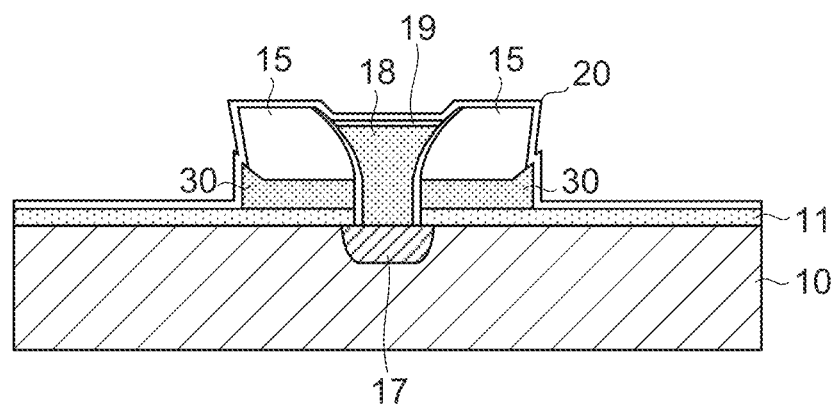
FIG. 3C is a sectional view illustrating the method of manufacturing the semiconductor device according to the embodiment of the disclosure.

Next, a tunnel insulating film 20 made of an insulator such as silicon dioxide ($SiO_2$) and having a thickness of about 10 nm is formed by, for example, the CVD method so as to cover the exposed portions of the gate insulating film 11, the floating gate 30, the spacer 15, and the protection film 19 (FIG. 3C).

Figure 3D:
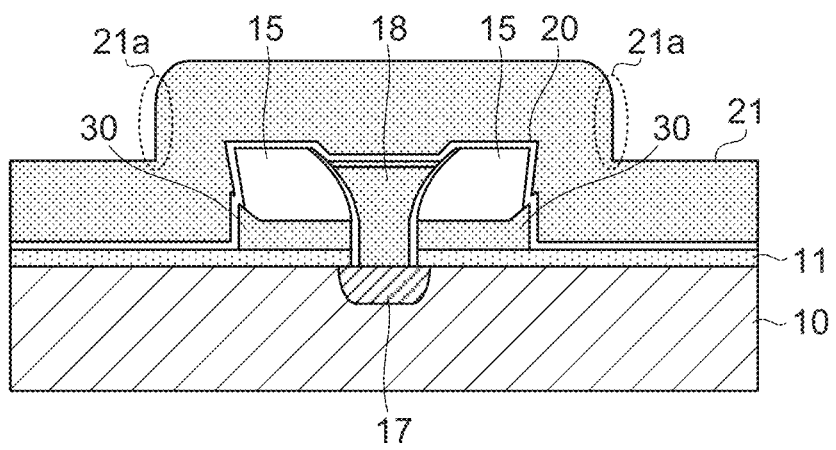
FIG. 3D is a sectional view illustrating the method of manufacturing the semiconductor device according to the embodiment of the disclosure.
Figure 9A:
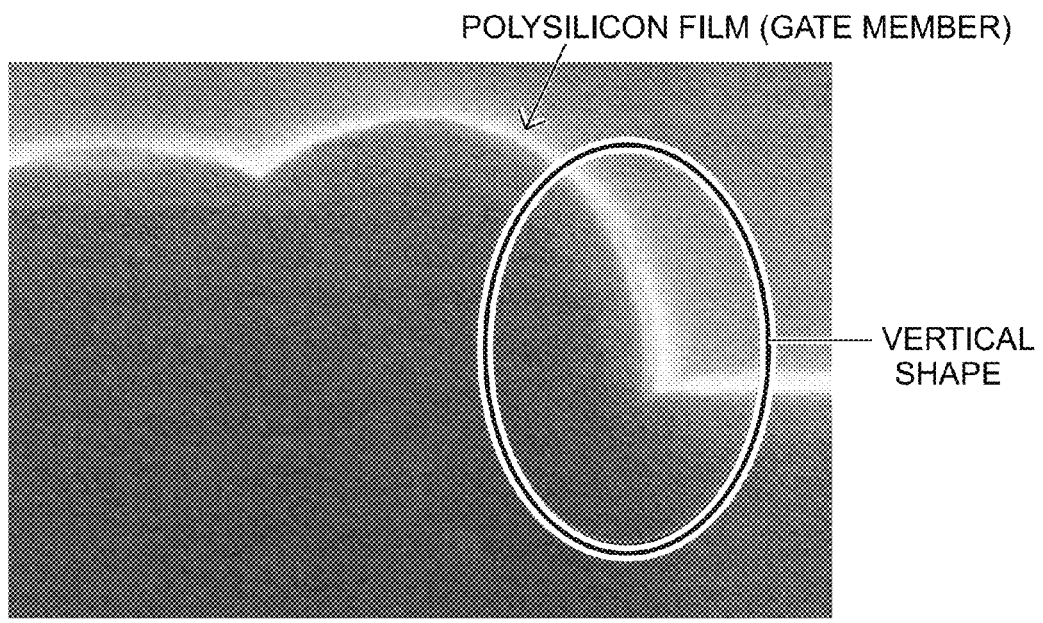
FIG. 9A is an SEM image showing a coverage shape of the polysilicon film in a case where the manufacturing method according to the embodiment of the disclosure is applied.

Next, a polysilicon film 21 having a thickness of about 200 nm is formed by, for example, the CVD method so as to cover the surface of the tunnel insulating film 20. The polysilicon film 21 is insulated from the floating gate 30 by the tunnel insulating film 20. The polysilicon film 21 constitutes a control gate of the memory cell. The polysilicon film 21 is an example of a second gate member in the disclosure. The shape of the polysilicon film 21 becomes a coverage shape that conforms to the shape of the structure including the floating gate 30 and the spacer 15 buried therein. In the manufacturing method according to the embodiment, the upper surface of the spacer 15 is flattened in the previous step, and the cross-sectional shape of the structure is made a substantially rectangular shape. For this reason, a step portion 21a of the polysilicon film 21 becomes substantially vertical (FIG. 3D). FIG. 9A is a scanning electron microscope (SEM) image showing the coverage shape of the polysilicon film in a case where the manufacturing method according to the embodiment of the disclosure is applied.

Figure 4A:
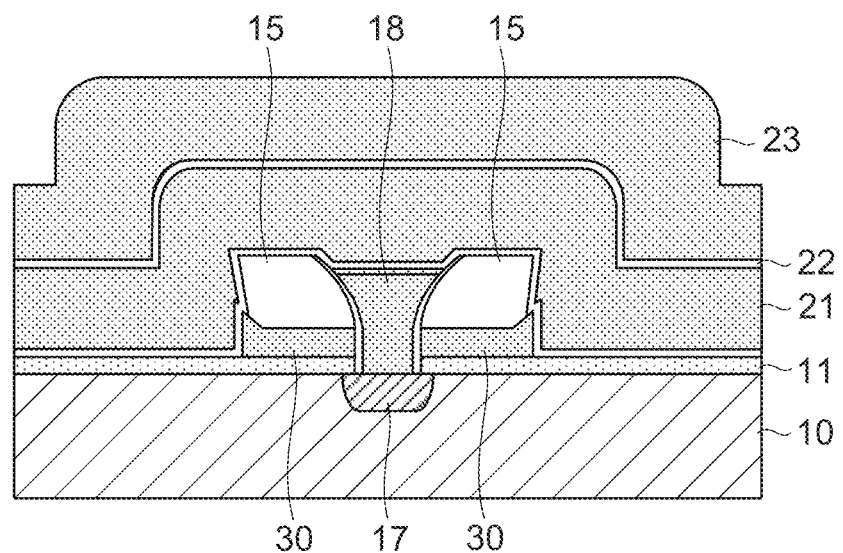
FIG. 4A is a sectional view illustrating the method of manufacturing the semiconductor device according to the embodiment of the disclosure.

Next, an insulating film 22 made of an insulator such as silicon dioxide ($SiO_2$) and having a thickness of about 8 nm is formed by, for example, the CVD method so as to cover the polysilicon film 21. Then, a polysilicon film 23 having a thickness of about 100 nm is formed by, for example, the CVD method so as to cover the insulating film 22 (FIG. 4A). The insulating film 22 constitutes a gate insulating film of a transistor (not illustrated) constituting a peripheral circuit which is formed together with the memory cell on the silicon substrate 10. The insulating film 22 is an example of a first insulating film in the disclosure. The polysilicon film 23 constitutes a gate of the transistor constituting the peripheral circuit. Subsequently, the polysilicon film 23 is patterned by the etching. At this time, the polysilicon film 23 formed on the polysilicon film 21 is removed.

Figure 4B:
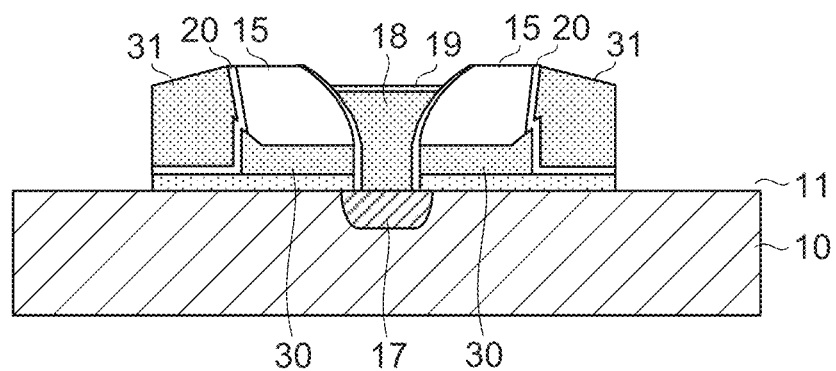
FIG. 4B is a sectional view illustrating the method of manufacturing the semiconductor device according to the embodiment of the disclosure.
Figure 10A:
FIG. 10A is an SEM image showing the shape of a control gate in a case where the manufacturing method according to the embodiment of the disclosure is applied.

Next, the polysilicon film 21 is patterned by the etch-back processing in which the polysilicon film 21 retreats while removing the insulating film 22 through, for example, the anisotropic dry etching. Hence, a control gate (word line) 31 is formed (FIG. 4B). FIG. 10A is an SEM image showing the shape of the control gate in a case where the manufacturing method according to the embodiment of the disclosure is applied. The control gate 31 is an example of a second gate in the disclosure.

Figure 4C:
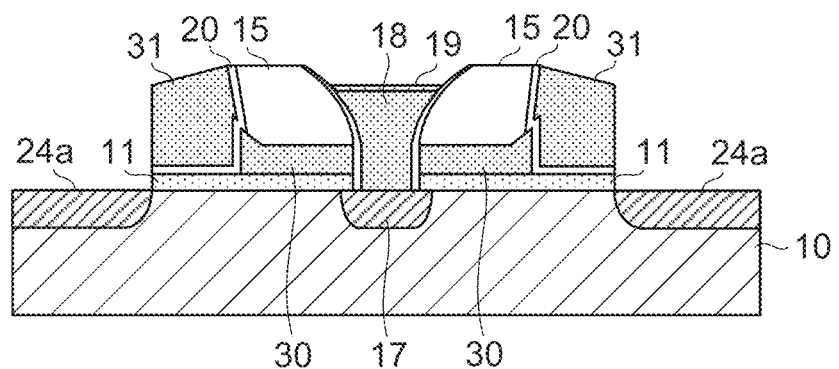
FIG. 4C is a sectional view illustrating the method of manufacturing the semiconductor device according to the embodiment of the disclosure.

Next, an n-type drain 24a of a low concentration is formed on the surface of the silicon substrate 10 by, for example, the ion implantation method. In the ion implantation method, the control gate 31 is used as a mask, and the pentavalent element such as phosphorous is injected into the silicon substrate 10. The amount of ion injection is, for example, $1\times10^{13}/cm^2$ (FIG. 4C).

Figure 5A:
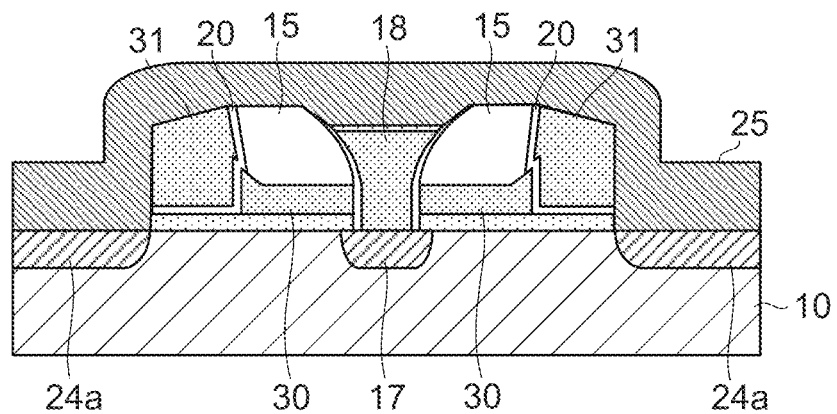
FIG. 5A is a sectional view illustrating the method of manufacturing the semiconductor device according to the embodiment of the disclosure.

Next, an insulating film 25 is formed by, for example, the CVD method so as to cover the entire memory cell (FIG. 5A). The insulating film 25 constitutes a side wall of the control gate 31. The insulating film 25 may be constituted, for example, by a layered film in which the NSG film having a thickness of about 10 nm and the SiN film having a thickness of about 90 nm are layered one on another. The insulating film 25 may be a single layered film made of a signal material. The insulating film 25 is an example of a second insulating film in the disclosure.

Figure 5B:
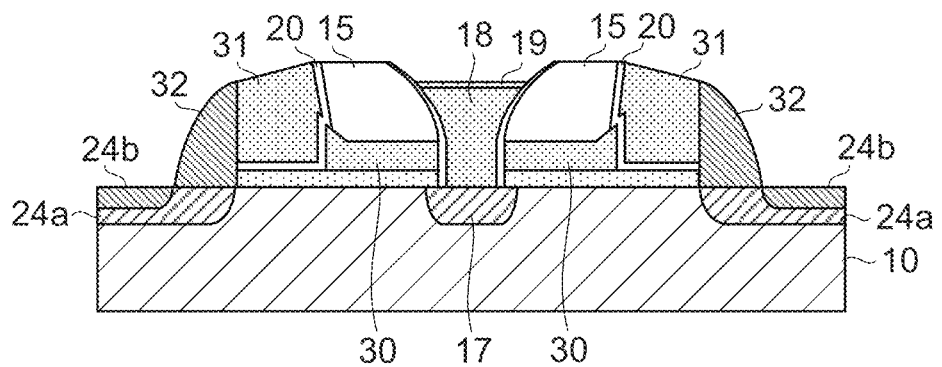
FIG. 5B is a sectional view illustrating the method of manufacturing the semiconductor device according to the embodiment of the disclosure.

Next, a side wall 32 is formed by the etch-back processing in which the insulating film 25 retreats through, for example, the anisotropic dry etching. The side wall 32 is formed so as to abut on the side surface of the control gate 31 and to cover the end portion of the drain 24a of the low concentration. Next, an n-type drain 24b of a high concentration is formed in the drain 24a of the low concentration by, for example, the ion implantation method. In the ion implantation step, the control gate 31 and the side wall 32 are used as masks, and the pentavalent element such as phosphorous is injected into the surface of the drain 24a. The amount of ion injection is, for example, $1\times10^{15}/cm^2$ (FIG. 5B). The drains 24a and 24b are an example of the drain in the disclosure.

Figure 5C:
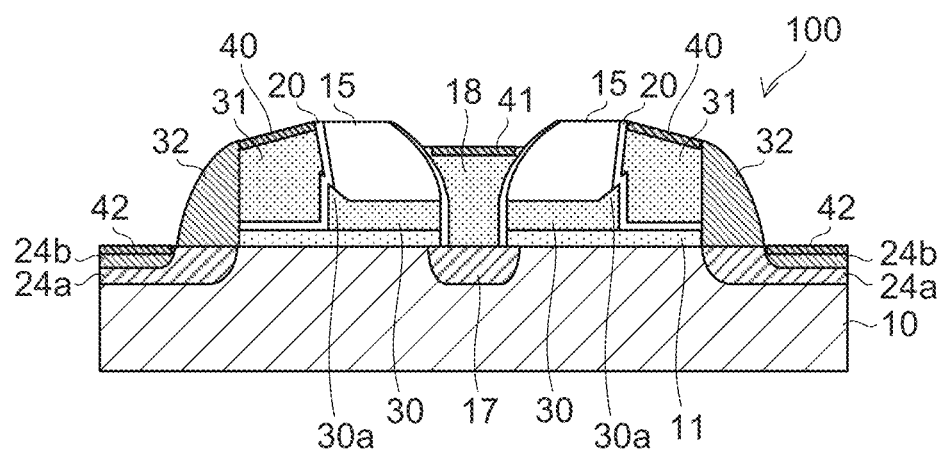
FIG. 5C is a sectional view illustrating the method of manufacturing the semiconductor device according to the embodiment of the disclosure.

Next, after the protection film 19 covering the upper surface of the source wiring 18 is removed, a cobalt film having a thickness of about 10 nm is formed by, for example, a sputtering method so as to cover the entire memory cell. Next, a rapid thermal anneal (RTA) processing at a temperature of about 550° C. is carried out. In this thermal processing, cobalt and silicon react with each other, and silicide layers 40, 41, and 42 are respectively formed on the surfaces of the control gate 31, the source wiring 18, and the drain 24b. Subsequently, unreacting cobalt deposited on the spacer 15 and the side wall 32 is removed by washing using a sulfuric acid/hydrogen peroxide mixture or an ammonia hyperhydration (FIG. 5C). The silicide layer formed in a self-aligned manner in such a way is called salicide. The resistance of the control gate 31, the source wiring 18, and the drain 24b can be reduced by forming the silicide layers 40, 41, and 42. The silicide layers 40, 41, and 42 are an example of a metal compound layer in the disclosure. Instead of cobalt, molybdenum, tungsten, titanium, or nickel may be used.

A semiconductor memory 100 as the semiconductor device according to the embodiment of the disclosure is completed through the steps described above. In other words, the semiconductor memory 100 includes the silicon substrate 10, the floating gate 30 provided on the silicon substrate 10 through the gate insulating film 11, and the spacer 15 provided on the floating gate 30 and having the flattened surface. The semiconductor memory 100 further includes the control gate 31 provided on the silicon substrate 10 and adjacent to the floating gate 30 and the spacer 15, the source 17 and drains 24a and 24b provided at positions to interpose the floating gate 30 and the control gate 31, and the source wiring 18 electrically connected to the source 17. The semiconductor memory 100 further includes the silicide layers 40, 41, and 42 which are respectively provided on the upper surface of the control gate 31, the upper surface of the source wiring 18, and the upper surface of the drain 24b.

The semiconductor memory 100 has a structure in which two memory cells are symmetrically disposed with respect to the source 17 as the center. For example, in the case of writing data "0" to the memory cell, the voltage of the silicon substrate 10 is set to 0 V, and a predetermined voltage is applied to each of the control gate (word line) 31 and the source wiring 18. Hence, a current flows in a channel region immediately below the control gate 31 and the floating gate 30, and hot electrons are injected into the floating gate 30 through the gate insulating film 11. The hot electrons are held in the floating gate 30. The injection of the hot electrons into the floating gate 30 increases a threshold voltage of the memory cell. On the other hand, in the case of writing data "1" to the memory cell, the hot electrons are not injected into the floating gate 30. Therefore, the threshold voltage of the memory cell in the case of writing data "1" to the memory cell becomes small as compared to the case of writing data "0."

In the case of deleting data "0" written in the memory cell, the voltages of the drains 24a and 24b and the source wiring 18 are set to 0 V, and a predetermined voltage is applied to the control gate 31. Hence, a Fowler-Nordheim tunneling current flows in the tunnel insulating film 20, and the electrons accumulated in the floating gate 30 are extracted to the control gate 31. Since the sharp portion 30a is formed in the end portion of the floating gate 30, an electric field is concentrated in this portion, and the data can be deleted at a relatively low voltage. Assignment of data "0" and data "1" may be the reverse of the above-described assignment.

Hereinafter, a method of manufacturing a semiconductor memory as a semiconductor device according to a comparative example will be described. FIGS. 6A to 6C and FIGS. 7A to 7C are sectional views illustrating a method of manufacturing a semiconductor device according to a comparative example. The manufacturing method according to the comparative example is different from the manufacturing method according to the embodiment of the disclosure in that the flattening processing of the spacer 15 (see FIG. 2D) is omitted. Other steps are the same as those in the manufacturing method according to the embodiment of the disclosure, and the redundant description will be omitted if appropriate.

Figure 6A:
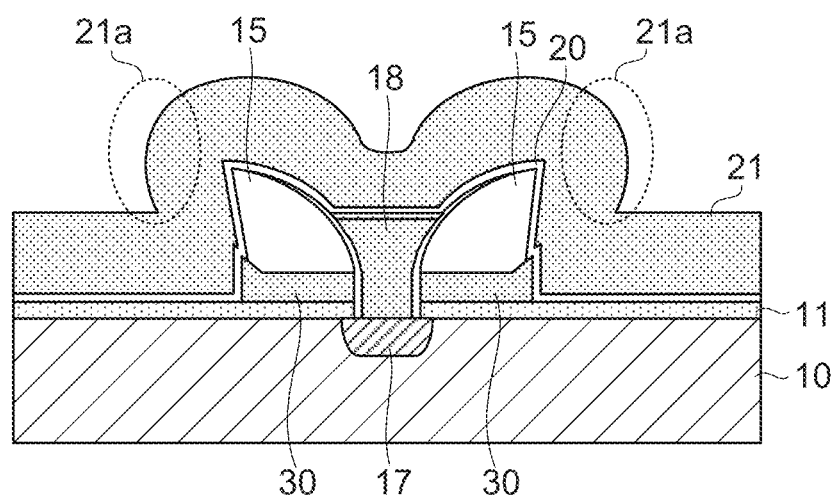
FIG. 6A is a sectional view illustrating a method of manufacturing a semiconductor device according to a comparative example.
Figure 9B:
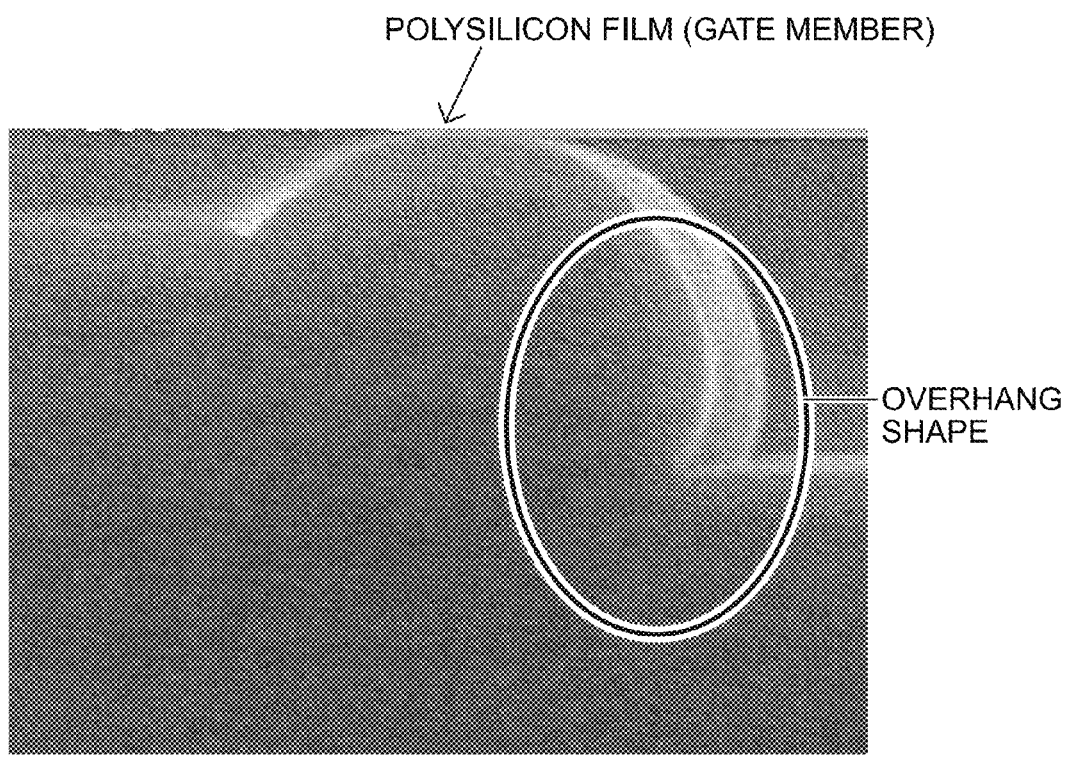
FIG. 9B is an SEM image showing the coverage shape of the polysilicon film in a case where the manufacturing method according to the comparative example is applied.

FIG. 6A corresponds to FIG. 3D. As illustrated in FIG. 6A, the polysilicon film 21 constituting the control gate is formed so as to cover the side surface of the tunnel insulating film 20. The shape of the polysilicon film 21 becomes the coverage shape that conforms to the shape of the structure including the floating gate 30 and the spacer 15 buried therein. In the manufacturing method according to the comparative example, the flattening processing of the spacer 15 is not carried out, and the shape of the spacer 15 after the etch-back processing is maintained as such. For this reason, the step portion 21a of the polysilicon film 21 has an overhang shape. FIG. 9B is a scanning electron microscope (SEM) image showing the coverage shape of the polysilicon film 21 in a case where the manufacturing method according to the comparative example is applied.

FIG. 6B corresponds to FIG. 4A. As illustrated in FIG. 6B, the insulating film 22 made of an insulator such as silicon dioxide $(SiO_2)$ is formed so as to cover the polysilicon film 21 having the overhang shape. The insulating film 22 is formed along the overhang shape of the polysilicon film 21. The insulating film 22 constitutes a gate oxide film of the transistor (not illustrated) constituting the peripheral circuit which is formed on the silicon substrate 10 together with the memory cell. Then, the polysilicon film 23 is formed so as to cover the insulating film 22. The polysilicon film 23 constitutes the gate of the transistor constituting the peripheral circuit. Then, the polysilicon film 23 is etched and patterned. At this time, the polysilicon film 23 formed on the polysilicon film 21 is removed.

Figure 10B:
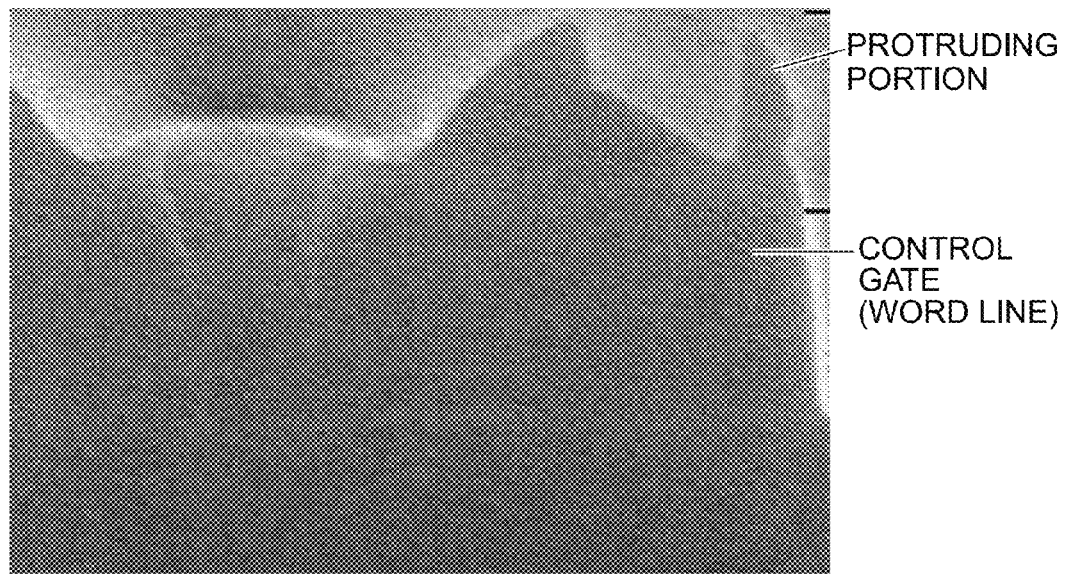
FIG. 10B is an SEM image showing the shape of the control gate in a case where the manufacturing method according to the comparative example is applied.

FIG. 6C corresponds to FIG. 4B. As illustrated in FIG. 6C, the polysilicon film 21 is patterned by the etch-back processing in which the polysilicon film 21 retreats while removing the insulating film 22 by the anisotropic dry etching. Hence, the control gate (word line) 31 is formed. In the etch-back processing, the insulating film 22 and the polysilicon film 21 are etched at the same time, but the etching of the insulating film 22 progresses slower than the etching of the polysilicon film 21 due to the overhang shape of the polysilicon film 21, and the insulating film 22 remains in a protruding shape at the time of completion of the etch-back processing. Hence, a protruding portion 31a is generated in the end portion of the control gate 31. The mechanism of the generation of the protruding portion 31a will be described below in detail. FIG. 10B is an SEM image showing the shape of the control gate 31 in a case where the manufacturing method according to the comparative example is applied.

Figure 7A:
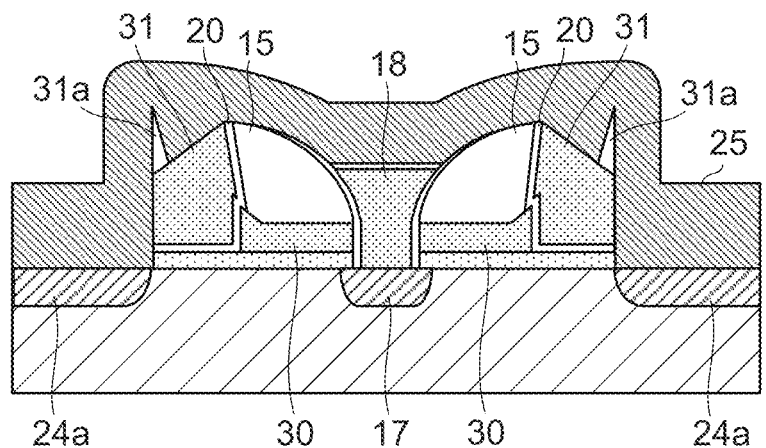
FIG. 7A is a sectional view illustrating the method of manufacturing the semiconductor device according to the comparative example.

FIG. 7A corresponds to FIG. 5A. As illustrated in FIG. 7A, the control gate 31 is covered by the insulating film 25 constituting the side wall while the control gate 31 has the protruding portion 31a.

Figure 7B:
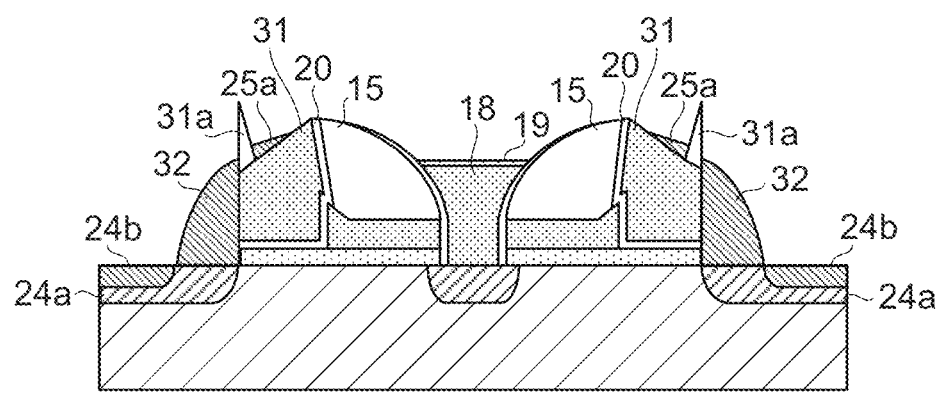
FIG. 7B is a sectional view illustrating the method of manufacturing the semiconductor device according to the comparative example.

FIG. 7B corresponds to FIG. 5B. As illustrated in FIG. 7B, the side wall 32 is formed by the etch-back processing in which the insulating film 25 retreats. The insulating film 25 covering the upper surface of the control gate 31 cannot be removed completely due to the protruding portion 31a generated in the control gate 31, and a residue 25a of the insulating film 25 is left on the upper surface of the control gate 31.

Figure 7C:
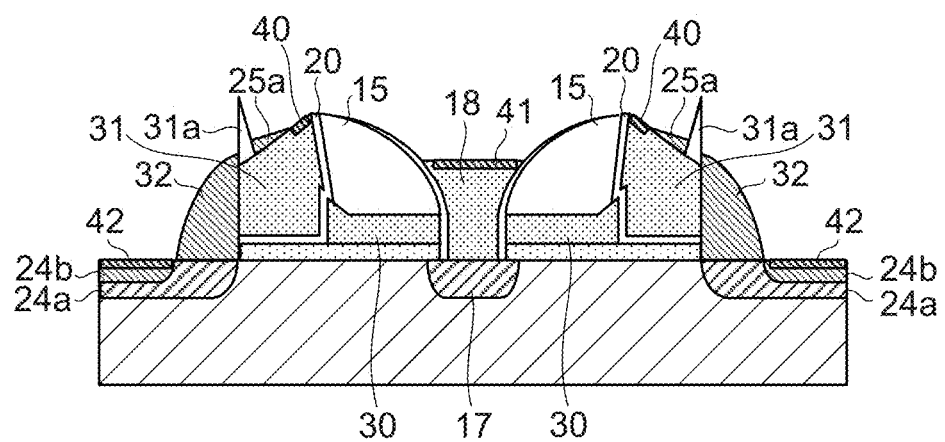
FIG. 7C is a sectional view illustrating the method of manufacturing the semiconductor device according to the comparative example.

FIG. 7C corresponds to FIG. 5C. As illustrated in FIG. 7C, the silicide layers 40, 41, and 42 are respectively formed on the surfaces of the control gate 31, the source wiring 18, and the drain 24b by a salicide process. However, since the residue 25a is left on the upper surface of the control gate 31, the area of the silicide layer 40 formed on the upper surface of the control gate 31 becomes significantly small as compared to the manufacturing method according to the embodiment of the present disclosure. Hence, it becomes difficult to sufficiently reduce the resistance the control gate 31.

As described above, in the manufacturing method according to the comparative example, the protruding portion 31a is generated in the control gate 31 due to the fact that the coverage shape at the time of forming the polysilicon film 21 constituting the control gate 31 becomes the overhang shape, and the formation of the silicide layer 40 on the upper surface of the control gate 31 is may be hindered.

Figure 8A:
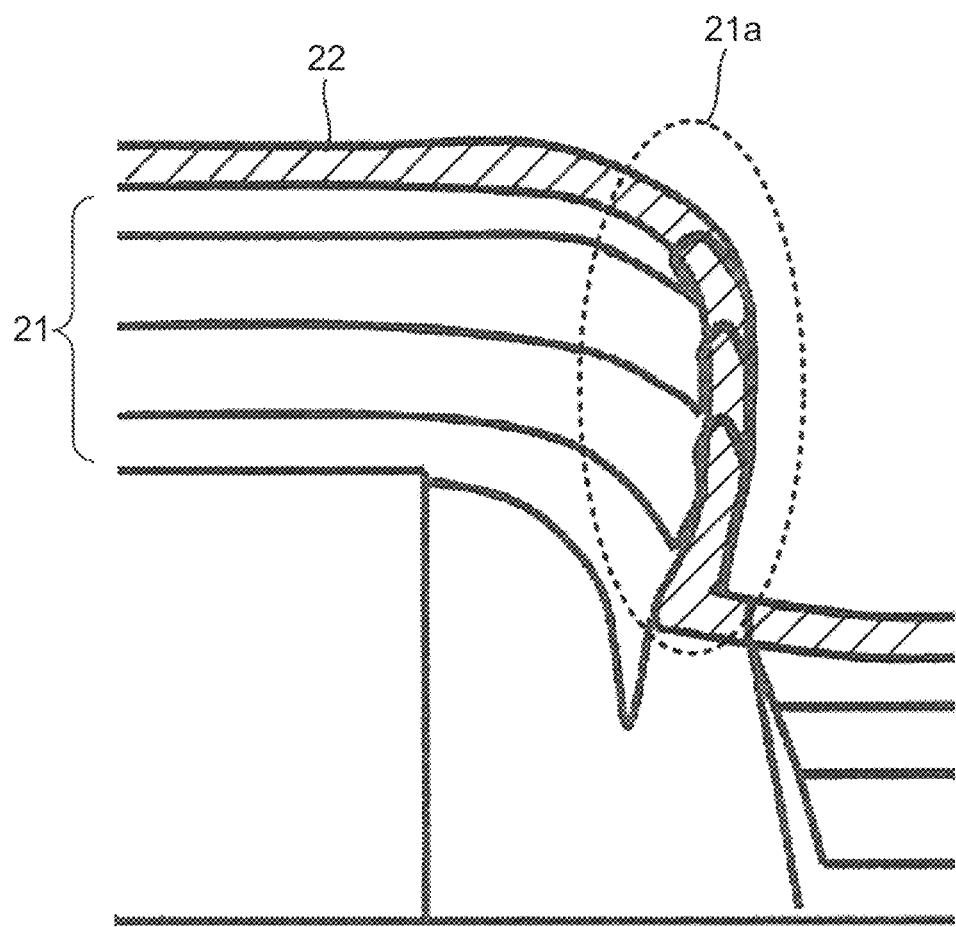
FIG. 8A is a sectional view illustrating a state where a polysilicon film and an insulating film are etched in a case where the manufacturing method according to the comparative example is applied.

FIG. 8A is a sectional view illustrating a state where the polysilicon film 21 and the insulating film 22 are etched by the etch-back processing of the polysilicon film 21 constituting the control gate 31 in the manufacturing method according to the comparative example.

In the manufacturing method according to the comparative example, as illustrated in FIG. 8A, the shape of the step portion 21a of the polysilicon film 21 becomes the overhang shape. The insulating film 22 covering the surface of the polysilicon film 21 is formed along the overhang shape of the polysilicon film 21. When the etch-back processing of the polysilicon film 21 is performed by the anisotropic dry etching, the insulating film 22 covering the upper surface of the polysilicon film 21 is removed, and the upper surface of the polysilicon film 21 is exposed, the polysilicon film 21 and a portion covering the side surface of the polysilicon film 21 of the insulating film 22 are etched at the same time. However, while the polysilicon film 21 retreats along the thickness direction over time, the insulating film 22 retreats along the overhang shape. In other words, an etching distance of the insulating film 22 becomes longer than the etching distance of the polysilicon film 21. Therefore, the etching of the insulating film 22 progresses slower than the etching of the polysilicon film 21, and the height of the etching target portion of the insulating film 22 becomes always higher than the height of the etching target portion of the polysilicon film 21. As a result, at the time of completion of the etch-back processing of the polysilicon film 21, the insulating film 22 is left in the protruding shape. Hence, the protruding portion 31a is generated in the end portion of the control gate 31 (see FIGS. 6C and 10B).

Figure 8B:
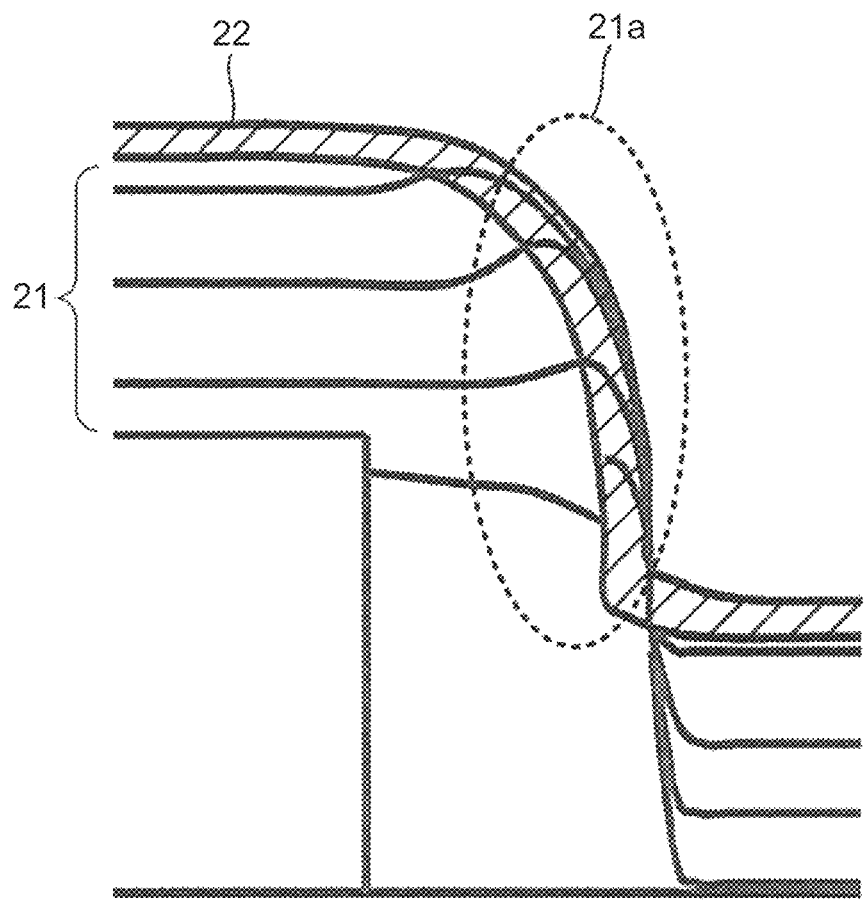
FIG. 8B is a sectional view illustrating a state where the polysilicon film and the insulating film are etched in a case where the manufacturing method according to the embodiment of the disclosure is applied.

FIG. 8B is a sectional view illustrating a state where the polysilicon film 21 and the insulating film 22 are etched by the etch-back processing of the polysilicon film 21 constituting the control gate 31 in the manufacturing method according to the embodiment of the disclosure. In the manufacturing method according to the embodiment of the disclosure, the flattening processing (FIG. 2D) of the spacer 15 is performed before the polysilicon film 21 is formed. Hence, as illustrated in FIG. 8B, the shape of the step portion 21a of the polysilicon film 21 becomes a substantially vertical shape. The insulating film 22 covering the surface of the polysilicon film 21 is formed along the vertical shape of the step portion 21a of the polysilicon film 21. When the etch-back processing of the polysilicon film 21 is performed by the anisotropic dry etching, the insulating film 22 covering the upper surface of the polysilicon film 21 is removed, and the upper surface of the polysilicon film 21 is exposed, the polysilicon film 21 and a portion covering the side surface of the polysilicon film 21 of the insulating film 22 are etched at the same time. In the manufacturing method according to the embodiment of the disclosure, since the etching distance of the insulating film 22 and the etching distance of the polysilicon film 21 are substantially equal, the etching progresses in a state where the height of the etching target portion of the insulating film 22 substantially matches with the height of the etching target portion of the polysilicon film 21. Therefore, at the time of completion of the etch-back processing of the polysilicon film 21, it is suppressed that the insulating film 22 is left and the protruding portion is generated in the end portion of the control gate 31 (see FIGS. 4B and 10A). By suppressing that the structure of the protruding shape in the control gate 31 is generated, the silicide layer 40 can be formed over the entire upper surface of the control gate 31, and the resistance of the control gate 31 can be sufficiently reduced.

Figure 8C:
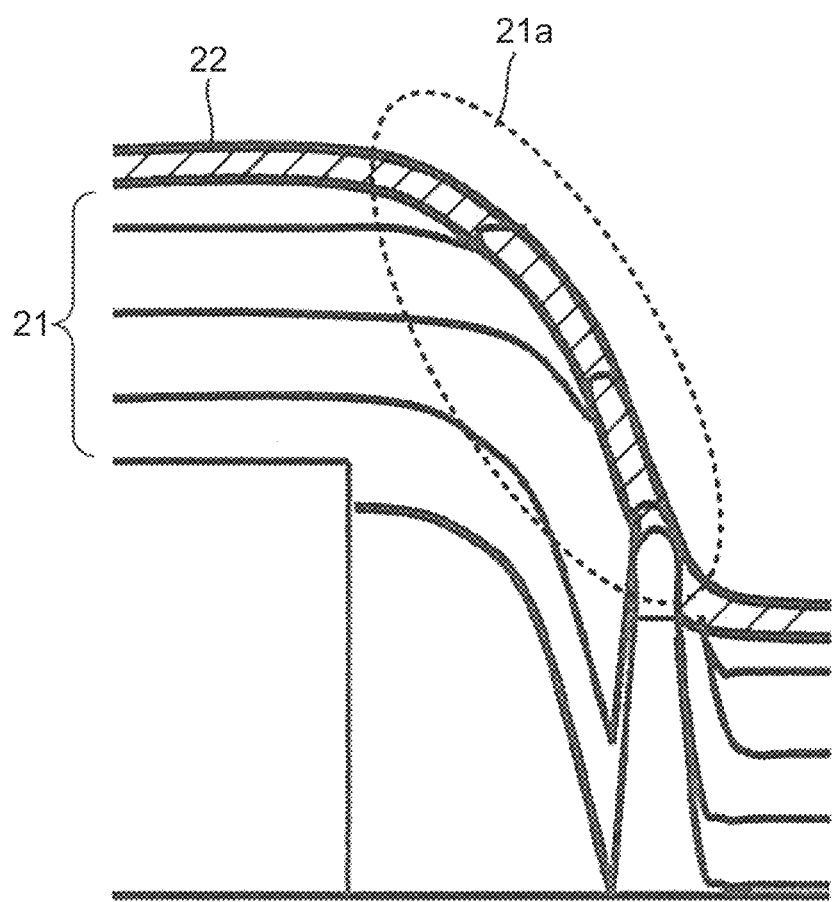
FIG. 8C is a sectional view illustrating a state where the polysilicon film and the insulating film are etched in a case where the shape of a step portion of the polysilicon film is a tapered shape.

FIG. 8C is a sectional view illustrating a state where the polysilicon film 21 and the insulating film 22 are etched by the etch-back processing of the polysilicon film 21 in a case where the shape of the step portion 21a of the polysilicon film 21 becomes a tapered shape. In a case where the coverage shape of the polysilicon film 21 becomes the tapered shape, it is possible to avoid that the insulating film 22 is left in the protruding shape. However, at the time of completion of the etch-back processing, the area of the flat portion on the upper surface of the polysilicon film 21 becomes smaller than a case where the manufacturing method according to the embodiment of the disclosure is applied. As a result, the area of the silicide layer covering the upper surface of the control gate becomes smaller than a case where the manufacturing method according to the embodiment of the disclosure is applied, and it becomes difficult to sufficiently reduce the resistance of the control gate 31.

In this way, preferably, the shape of the step portion 21*a* of the polysilicon film 21 constituting the control gate 31 is a nearly vertical shape. In the manufacturing method according to the embodiment of the disclosure, the shape of the step portion 21*a* of the polysilicon film 21 can be made a substantially vertical shape. Hence, it is possible to suppress the formation of the structure of the protruding shape which hinders the formation of the silicide layer on the upper surface of the control gate 31.

The manufacturing method according to the embodiment of the disclosure is merely given as an example, and omissions, additions, and modifications of the steps, and changes of the materials to be used can be made without departing from the spirit of the disclosure.

What is claimed is:

1. A method of manufacturing a semiconductor device comprising:
   forming a first gate member on a semiconductor substrate through a gate insulating film;
   forming a spacer on the first gate member;
   flattening a surface of the spacer;
   forming a first gate by partially etching the first gate member using the spacer as a mask;
   forming a second gate member so as to cover the first gate and the spacer having the flattened surface;
   forming a first insulating film on a surface of the second gate member, after the second gate member is formed; and
   forming a second gate by causing the second gate member to retreat while removing the first insulating film by etching.

2. The manufacturing method according to claim 1, further comprising:
   forming a second insulating film so as to cover the second gate;
   forming a side wall, which abuts a side surface of the second gate, by causing the second insulating film to retreat by etching; and
   forming a metal compound layer on an upper surface of the second gate after the side wall is formed.

3. The manufacturing method according to claim 1, wherein flattening the surface of the spacer is performed by chemical mechanical polishing.

4. The manufacturing method according to claim 1, wherein, in flattening the surface of the spacer, the surface of the spacer is processed so as to be substantially parallel to a principal plane of the semiconductor substrate.

5. The manufacturing method according to claim 1, further comprising:
   forming a mask which includes an opening on the first gate member,
   wherein forming the spacer includes forming a spacer member so as to fill the opening, and causing the spacer member to retreat by etching.

6. The manufacturing method according to claim 1, further comprising:
   forming a source and a drain at positions between which the first gate and the second gate of the semiconductor substrate are interposed.

7. The manufacturing method according to of claim 6, wherein the first insulating film constitutes a gate insulating film of a semiconductor element other than a semiconductor element including the first gate, the second gate, the source, and the drain.

8. The manufacturing method according to claim 2, further comprising:
   forming a source and a drain at positions between which the first gate and the second gate of the semiconductor substrate are interposed; and
   forming a source wiring which is electrically connected to the source,
   wherein, in forming the metal compound layer on the upper surface of the second gate, the metal compound layer is formed on an upper surface of the source wiring and an upper surface of the drain.

9. The manufacturing method according to claim 5, wherein the spacer includes a pair of spacer pieces which are disposed to be separated in the opening, and
   the method further comprises:
   forming a source and a drain at positions between which the first gate and the second gate of the semiconductor substrate are interposed;
   forming a wiring material which is electrically connected to the source so as to fill a gap between the pair of spacer pieces; and
   forming a source wiring by etching the wiring material such that a height of an upper surface of the source wiring is lower than a height of the spacer before the surface of the spacer is flattened.

* * * * *